March 31, 1970 T. C. NEW ETAL 3,504,243

LOW SATURATION VOLTAGE TRANSISTOR WITH SYMMETRICAL STRUCTURE

Original Filed Sept. 21, 1967

WITNESSES

Edwin E. Bassler

James F. Young

INVENTORS
Thorndike C. New, Paul M. Kisinko
and Frederick G. Ernick
BY
C. L. Menzemer
ATTORNEY 3,504,243

LOW SATURATION VOLTAGE TRANSISTOR WITH SYMMETRICAL STRUCTURE

Thorndike C. New and Paul M. Kisinko, Greenburg, and Frederick G. Ernick, Youngwood, Pa., assignors to Westinghouse Electric Corporation, Pittsburgh, Pa., a corporation of Pennsylvania Continuation of application Ser. No. 669,460, Sept. 21, 1967. This application July 7, 1969, Ser. No. 842,805
Int. Cl. H01l 5/00, 11/00
U.S. Cl. 317—235 3 Claims

ABSTRACT OF THE DISCLOSURE

This invention provides a transistor capable of operating at a moderately high current and with an extremely low saturation voltage.

The low saturation voltage is achieved as a result of the emitter and collector having symmetrical doping profiles, and being substantially identical in shape. In addition, the base region is divided into two regions of the same type of semiconductivity. The portion to which the base contact is affixed being more heavily doped than the remainder of the base region.

This application is a continuation of application Ser. No. 669,460, filed Sept. 21, 1967.

BACKGROUND OF THE INVENTION

This invention is in the field of transistors.

In the past attempts have been made to minimize the saturation resistance in a transistor by obtaining equal and opposite voltage drops as a result of having symmetrical doping profiles in the emitter and collector. This has not been entirely satisfactory because, at high current levels conductivity modulation and emitter-base voltage drop along the base current path cause the effective emitter-to-base junction voltage to vary and thus the injection is not uniform.

SUMMARY OF THE INVENTION

This invention provides a transistor having an emitter region, a base region, a collector region and electrical metal contacts affixed to each of the regions, the emitter and collector region having symmetrical doping profiles and being substantially identical in shape, the base region consisting on two sub-regions of the same type of semiconductivity, the sub-region to which the base contact is affixed being more heavily doped than the other sub-region.

DESCRIPTION OF THE DRAWING

For a more detailed description of the nature of this invention reference should be had to the following detailed description and drawing in which.

DESCRIPTION OF THE PREFERRED EMBODIMENT

Figure 1:
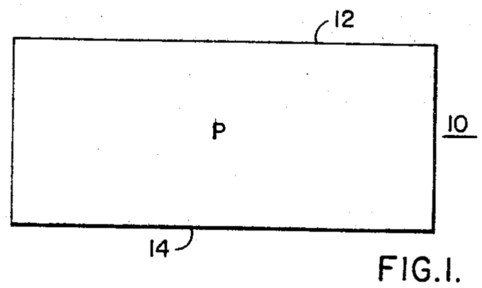
FIGURE 1 is a side view of a body of semiconductor material suitable for use in accordance with the teachings of this invention.

With reference to FIG. 1, there is shown a body 10 of a semiconductor material. The body 10 has a top surface 12 and a bottom surface 14.

The body 10 may be of any semiconductor material known to those skilled in the art such for example as silicon, germanium, silicon carbide, stoichiometric compound of a Group III and a Group V element or a stoichiometric compound of a Group II and a Group VI element.

The body 10 may have either a p- or n-type of semiconductivity and be doped to a concentration of from $10^{14}$ to $10^{17}$ atoms of dopant per cubic centimeter of semiconductor material.

For the purpose of simplifying the explanation and description of this invention and if for no other reason it will be assumed that the body 10 is of p-type silicon with a doping concentration of from $10^{14}$ to $10^{15}$ atoms of dopant per cubic centimeter of silicon. A particularly suitable body would have a thickness of from 5 to 6 mils.

Figure 2:
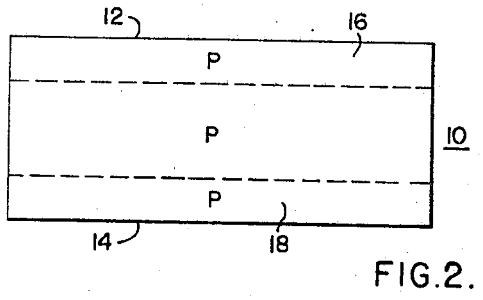

With reference to FIG. 2, the body 10 is disposed in a diffusion furnace and a p-type region 16 is formed in the body 10 by the diffusion of a p-type dopant, such for example as aluminum, boron, gallium and indium, through the top surface 12 of the body 10.

Simultaneously, a p-type region 18 is formed by diffusion through the bottom surface 14 of the body 10.

The p-type regions 16 and 18 have a dopant concentration of from $10^{17}$ to $10^{21}$ atoms of dopant per cubic centimeter of silicon.

The p-type region 18 is then removed by mechanical abrading or chemical etching or a combination of the two.

Figure 3:
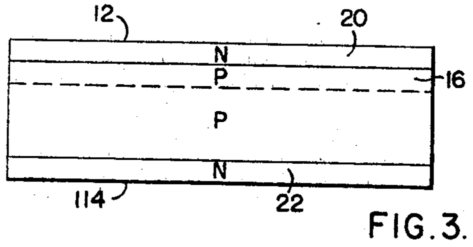

With reference to FIG. 3, the body 10 is again disposed in a diffusion furnace and an n-type region 20 is formed in the body 10 by the diffusion of an n-type dopant, such for example as phosphorus, antimony and arsenic through the top surface 12 of the body 10.

The n-type region 20 does not extend as deeply into the body 10 as p-type region 16.

Simultaneously, an n-type region 22 is formed in the body 10 by diffusion through bottom surface 114 of the body 10.

Since n-type regions 20 and 22 were formed at the same time they have symmetrical doping profiles. Both regions are doped to a concentration of from $10^{18}$ to $10^{21}$ atoms of dopant per cubic centimeter of silicon.

Figure 4:
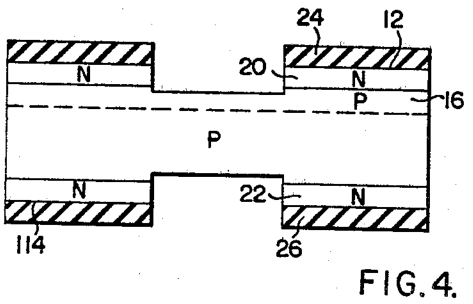

With reference to FIG. 4, a layer 24 and a layer 26 of a photo-resist masking material is disposed on the outer peripheral portions of surfaces 12 and 114 of body 10 respectively and the central unmasked portions of the body is etched away.

The etching of the top surface 12 is carried out to a depth such as to ensure the complete removal of n-type region 20 from the unmasked portion of the body 10.

The etching of the bottom surface 114 is carried out to a depth equal to the depth of the etching of the top surface.

Figure 5:
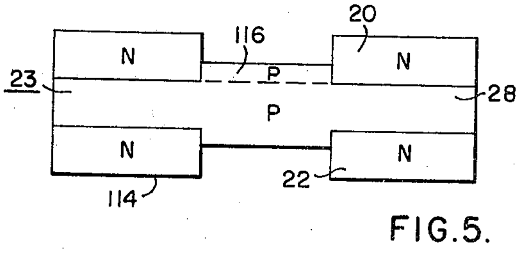
FIGS. 2 to 6 are side views, partially in section, of the body of FIG. 1 being processed in accordance with the teachings of this invention.

With reference to FIG. 5, the photo-resist material is removed and the body 10 is heated at about 1200° C. for a period of time to drive the n-type regions 20 and 22 deeper into the body 10 by solid state diffusion.

This driving in of the n-type regions 20 and 22 cause the n-type region 20 to overtake that part of region 16 directly under region 20 and convert it to n-type. The driving in also causes p-type regions 16 to be driven into the body 10 to a depth approximately equal to the depth of region 10.

As a result of this drawing the body 10 is now comprised of n-type regions 20 and 22 and a p-type region 23 which is divided into two sub-regions 116 and 28. The sub-region 116 consists of what is left of the p-type region 16 and has a doping concentration of from $10^{18}$ to $10^{21}$ atoms of dopant per cubic centimeter of silicon.

The p-type sub-region 28 consists of the original p-type material of body 10. Sub-region 28 has a doping concentration of from $10^{14}$ to $10^{17}$ atoms of dopant per cubic centimeter of silicon.

If the original body 10 had a thickness of about 5 to 6 mils it is desirable that regions 20 and 22 now each have a thickness of about 1.5 mils.

Figure 6:
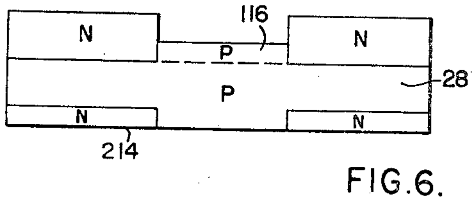

With reference to FIGS. 5 and 6, the bottom surface 114 of the body 10 is now etched away to provide a bottom surface 214 which is planar.

Figure 7:
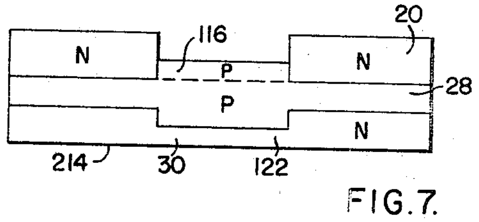
FIG. 7 is a side view, partially in section, of a transistor prepared in accordance with the teachings of this invention.

With reference to FIG. 7, the body 10 is disposed in a diffusion furnace and n-type dopant is diffused through bottom surface 214 to form a continuous n-type region which consists of two portions, the original n-type region 22 and an n-type portion 30. The new n-type region 122 extends entirely across the bottom of the body 10. The portion 30 has a doping concentration substantially equal to that of region 22.

The portion 30 has been formed primarily to provide a continuous collector region so that when an electrical contact is affixed to surface 214 it will be in an electrically conductive relationship with the collector region over its entire area. The original region 22 portion is however the effective collector region. It should be noted that n-type region 20 and the effective collector region, portion 22, are substantially identical in shape.

Figure 8:
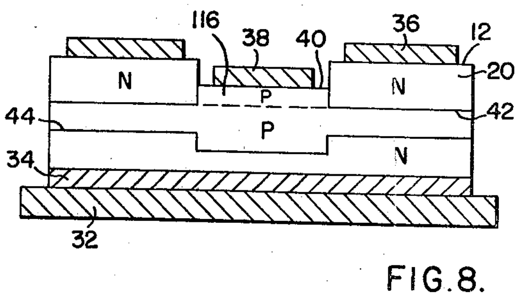

With reference to FIG. 8 an electrical contact 32, which will serve as the collector contact, is joined to surface 214 of the body 10 by a solder layer 34.

The solder layer 34 may be hard solder, one melting at 375° C. or higher, or a soft solder melting below 375° C.

An aluminum layer 36 is evaporated onto n-type region 20 to serve as an emitter contact and a second aluminum layer 38 is evaporated onto surface 40 of p-type sub-region 116 to serve as a base contact.

The device shown in FIG. 7 is a transistor. Region 20 is the emitter, region 23 the base, and region 122 the collector region with portion 22 being the effective collector.

There is a p-n junction 42 between the emitter region 20 and the base region 23 and a p-n junction 44 between the base region 23 and the collector region 122.

Due to the emitter region and the effective collector region having symmetrical doping profiles and being substantially identical in shape the device of this invention will handle relatively high currents (75 amperes) with an extremely low (0.2 volt) saturation voltage.

In addition, by allowing or causing the highly doped sub-region 116 to diffuse deeply into the body, the base current flow with respect to either emitter or collector is as nearly symmetrical as physically practical. The sub-region 28 is relatively lightly doped so that the blocking voltage capability of the device is maintained.

With the geometrical symmetry and nearly equivalent base current flow paths, the gradient of axial carrier distribution; perpendicular to the emitter and collector junction planes, will also be nearly symmetrical.

As a result of all these features there is provided a high current transistor with an extremely low saturation voltage.

While the invention has been described with reference to particular embodiments, it will be understood, of course, that modifications substitution and the like may be made without departing from its scope.

We claim as our invention:

1. A transistor, said transistor having a top and bottom surface, said transistor having an emitter region, a base region, a collector region and electrical metal contacts affixed to each of the regions, the emitter region being disposed about the periphery of the top surface of the transistor, and covering less area than the complete top surface area of the transistor, the electrical metal contact to the base region being disposed upon the top surface of the transistor within the area not covered by the emitter, the base region being divided into two sub-regions, the collector region being divided into an effective collector portion, and a second portion, the effective collector being the portion of the collector region disposed beneath the emitter region, the effective collector portion and the emitter region having symmetrical doping profiles and being substantially identical in shape, the sub-region of the base region between the emitter and effective collector region being of a lesser thickness than the sub-region of the base region to which the base contact is affixed.

2. The transistor of claim 1 in which the sub-region of the base region to which the base contact is affixed is more heavily doped than the other sub-region of the base region.

3. The device of claim 2 in which the emitter region is doped to a concentration of from $10^{18}$ to $10^{21}$ atoms of dopant per cubic centimeter of semiconductor material, the collector region is doped to a concentration of from $10^{18}$ to $10^{21}$ atoms of dopant per cubic centimeter of semiconductor material, the sub-region of the base region to which the base contact is affixed is doped to a concentration of from $10^{18}$ to $10^{21}$ atoms of dopant per cubic centimeter of semiconductor material and the other sub-region of the base region is doped to a concentration of from $10^{14}$ to $10^{17}$ atoms per cubic centimeter of semiconductor material.

References Cited

UNITED STATES PATENTS

| | | | |
|---|---|---|---|
| 2,770,761 | 11/1956 | Pfann | 317—235 |
| 2,852,677 | 9/1958 | Shockley | 250—36 |
| 2,887,423 | 5/1959 | Beale | 148—33 |
| 3,309,241 | 3/1967 | Dickson | 148—33.5 |
| 3,220,896 | 11/1965 | Miller | 148—33.5 |
| 3,394,037 | 7/1968 | Robinson | 148—187 |

JOHN W. HUCKERT, Primary Examiner

M. H. EDLOW, Assistant Examiner